(12) United States Patent
Cheng et al.

(10) Patent No.: US 8,748,972 B2
(45) Date of Patent: Jun. 10, 2014

(54) FLASH MEMORY DEVICES AND METHODS FOR FABRICATING SAME

(71) Applicant: Spansion LLC, Sunnyvale, CA (US)

(72) Inventors: Ning Cheng, San Jose, CA (US); Fred Cheung, San Jose, CA (US); Ashot Melik-Martirosian, Sunnyvale, CA (US); Kyunghoon Min, Palo Alto, CA (US); Michael Brennan, Campbell, CA (US); Hiroyuki Kinoshita, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/920,742

(22) Filed: Jun. 18, 2013

(65) Prior Publication Data

US 2013/0277733 A1 Oct. 24, 2013

Related U.S. Application Data

(62) Division of application No. 11/615,489, filed on Dec. 22, 2006, now Pat. No. 8,486,782.

(51) Int. Cl.
*H01L 29/792* (2006.01)

(52) U.S. Cl.
USPC .............. 257/324; 438/261; 257/E21.679

(58) Field of Classification Search
USPC ............................................. 257/324
See application file for complete search history.

(56) References Cited

U.S. PATENT DOCUMENTS

| 6,177,317 | B1 | 1/2001 | Huang et al. |
| 6,756,271 | B1 | 6/2004 | Satoh et al. |
| 6,803,273 | B1 | 10/2004 | Ambrose et al. |
| 6,828,199 | B2 | 12/2004 | Ogura et al. |
| 6,894,339 | B2 | 5/2005 | Fan et al. |
| 2008/0099828 | A1 | 5/2008 | Heinrichsdorff et al. |

FOREIGN PATENT DOCUMENTS

| TW | 200633146 | 9/2006 |
| TW | 200634991 | 10/2006 |
| TW | 200707656 | 2/2007 |
| WO | 2006060116 | 6/2006 |

*Primary Examiner* — Sonya D McCall Shepard (57) ABSTRACT

Flash memory devices and methods for fabricating the same are provided. In accordance with an exemplary embodiment of the invention, a method for fabricating a memory device comprises the steps of fabricating a first gate stack and a second gate stack overlying a substrate. A trench is etched into the substrate between the first gate stack and the second gate stack and a first impurity doped region is formed within the substrate underlying the trench. The trench is filled at least partially with a conductive material.

10 Claims, 8 Drawing Sheets

FLASH MEMORY DEVICES AND METHODS FOR FABRICATING SAME

CROSS-REFERENCE TO RELATED APPLICATIONS

This application is a divisional of U.S. patent application Ser. No. 11/615,489, filed on Dec. 22, 2006, entitled "Flash Memory Devices and Methods for Fabricating Same," which is hereby incorporated herein by reference in their entirety.

FIELD OF THE INVENTION

The present invention generally relates to flash memory devices, and more particularly relates to memory devices with reduced transient program disturb and methods for fabricating the same.

BACKGROUND OF THE INVENTION

A type of commercially available flash memory product is a MirrorBit® memory device available from Spansion, LLC, located in Sunnyvale, Calif. A MirrorBit cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

Figure 1:
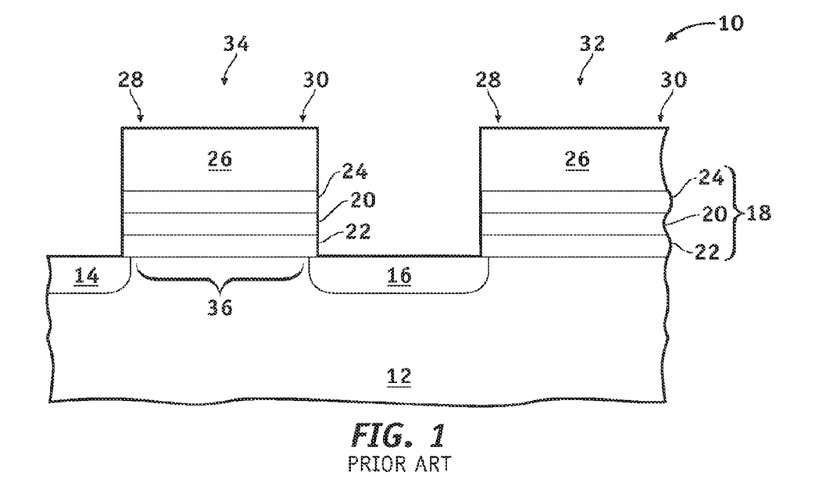
FIG. 1 is a cross-sectional view of a portion of a dual bit memory device available in the prior art.

An exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bit lines. A charge trapping layer or stack 18 is disposed on the top surface of the substrate between the bit lines. The charge trapping stack 18 typically comprises, for example, a charge trapping layer, often a silicon nitride layer 20, disposed between a first or bottom silicon dioxide layer (commonly referred to as a tunnel oxide layer) 22 and a second or top silicon dioxide layer 24. A gate electrode 26, which typically comprises an N or N+ polycrystalline silicon layer, is formed over the charge trapping stack to form a first storage element or bit 28 and a second storage element or bit 30 of memory cells 32 and 34. The charge trapping layer 20 of first storage bit 28 and the charge trapping layer 20 of second storage bit 30 of each memory cell 32 and 34 can be integral, as illustrated in FIG. 1, or can be separated by an isolation element, which typically is an oxide often referred to as a gate oxide.

A dual bit memory cell 34 is programmed utilizing a hot electron injection technique. More specifically, programming of the first bit 28 of memory cell 34 comprises injecting electrons into the charge trapping layer 20 and applying a bias between bit lines 14 and 16 while applying a high voltage to the control gate 26. In an exemplary embodiment, this may be accomplished by grounding bit line 16 and applying approximately 5 V to bit line 14 and approximately 10 V to the control gate 26. The voltage on the control gate 26 inverts a channel region 36 while the bias accelerates electrons from bit line 14 into the channel region 36 towards bit line 16. The 4.5 eV to 5 eV kinetic energy gain of the electrons is more than sufficient to surmount the 3.1 eV to 3.5 eV energy barrier at channel region 36/tunnel oxide layer 22 interface and, while the electrons are accelerated towards source/drain region 16, the field caused by the high voltage on control gate 26 redirects the electrons towards the charge trapping layer of first bit 28. Those electrons that cross the interface into the charge trapping layer remain trapped for later reading.

Similarly, programming the second bit 30 by hot electron injection into the charge trapping layer 20 comprises applying a bias between bit lines 16 and 14 while applying a high voltage to the control gate 26. This may be accomplished by grounding bit line 14 and applying approximately 5V to bit line 16 and approximately 10 V to the control gate 26. The voltage on the control gate 26 inverts the channel region 36 while the bias accelerates electrons from bit line 16 into the channel region 36 towards bit line 14. The field caused by the high voltage on control gate 26 redirects the electrons towards the charge trapping layer of second bit 30. Those electrons that cross the interface into charge trapping layer 20 of second bit 30 remain trapped for later reading.

With advances in semiconductor process technology, the trend is toward smaller and smaller semiconductor devices, including memory devices. However, as the-above described MirrorBit® is scaled smaller in size, transient program disturb (TPD) becomes a bigger challenge. TPD results during programming of the dual bit devices. For example, hot holes generated during programming of first bit 28 of memory cell 32 have a secondary impact ionization below bit line 16. Secondary electrons resulting from the secondary impact ionization diffuse to the disturbed cell 34 below gate 26 where they are accelerated by the drain depletion region and injected into the charge trapping stack 18 of second bit 30. This injection of secondary electrons into second bit 30 of cell 34 can adversely affect the memory window of bit 30.

Accordingly, it is desirable to provide a flash memory device with reduced transient program disturb. In addition, it is desirable to provide methods for fabricating flash memory devices with reduced transient program disturb. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a memory device comprises the steps of fabricating a first gate stack and a second gate stack overlying a substrate. A trench is etched into the substrate between the first gate stack and the second gate stack and a first impurity doped region is formed within the substrate underlying the trench. The trench is filled at least partially with a conductive material.

In accordance with another exemplary embodiment of the present invention, a method for fabricating a dual bit memory device comprises the steps of fabricating a charge trapping stack overlying a substrate and forming a control gate material overlying the charge trapping stack. The control gate material and the charge trapping stack are etched to the substrate to form a plurality of first gate stacks and a plurality of second gate stacks. The plurality of first gate stacks are disposed in a linear manner along a length of the substrate and the plurality of second gate stacks are disposed in a linear manner along the length of the substrate parallel to the plurality of first gate stacks. The substrate is etched to form a trench that extends between the plurality of first gate stacks and the plurality of second gate stacks along the length of the substrate. A first impurity dopant is implanted within the substrate underlying the trench to form a first bit line region and a conductor is formed within the trench extending along the length of the substrate.

In accordance with a further exemplary embodiment of the present invention, a method for fabricating a memory device comprises the steps of fabricating a first gate stack and a second gate stack overlying a substrate and forming a first impurity doped region in the substrate between the first gate stack and the second gate stack. Gate spacers are formed about sidewalls of the first gate stack and the second gate stack and a second impurity doped region is formed in the substrate between the first gate stack and the second gate stack using the gate spacers as an implant mask. The second impurity doped region is deeper than the first impurity doped region. A space between the first gate stack and the second gate stack is filled with a conductive material.

In accordance with yet another exemplary embodiment of the present invention, a memory device comprises a plurality of first gate stacks and a plurality of second gate stacks overlying a substrate. The plurality of first gate stacks are disposed in a linear manner along a length of the substrate and the plurality of second gate stacks are disposed in a linear manner along the length of the substrate parallel to the plurality of first gate stacks. A conductor is disposed within a trench in the substrate between the plurality of first gate stacks and the plurality of second gate stacks. The conductor and the trench extend along the length of the substrate. A first impurity doped region is disposed within the substrate and underlying the trench and the conductor. The first impurity doped region extends along the length of substrate.

In accordance with a further exemplary embodiment of the present invention, a memory device comprises a plurality of first gate stacks and a plurality of second gate stacks overlying a substrate. The plurality of first gate stacks are disposed in a linear manner along a length of the substrate and the plurality of second gate stacks are disposed in a linear manner along the length of the substrate parallel to the plurality of first gate stacks. A first impurity doped region is disposed within the substrate between the plurality of first gate stacks and the plurality of second gate stacks along the length of substrate. A second impurity doped region is disposed within the substrate between the plurality of first gate stacks and the plurality of second gate stacks along the length of substrate. The second impurity doped region is disposed deeper within the substrate than the first impurity doped region. A conductor is disposed overlying the substrate between the plurality of first gate stacks and a plurality of second gate stacks. The conductor extends along the length of the substrate and is in electrical contact with the first and second impurity doped regions.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 2:
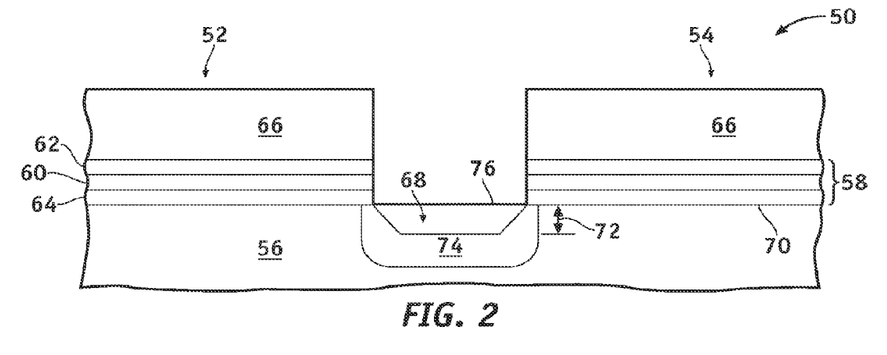
FIG. 2 is a cross-sectional view of a portion of a dual bit memory device in accordance with an exemplary embodiment of the present invention.

Referring to FIG. 2, in accordance with an exemplary embodiment of the present invention, a portion of a dual bit flash memory device 50 that may be programmed with reduced transient program disturb challenges is illustrated. Memory device 50 has a first gate stack 52 and a second gate stack 54 disposed on a P-type silicon substrate 56. Each gate stack 52 and 54 comprises a multi-layer dielectric-charge trapping-dielectric stack 58. Charge trapping stack 58 may comprise a thin first insulating layer 64, a charge trapping layer 60, and a second insulating layer 62. Thin first insulating layer 64 is often referred to as a tunnel oxide layer, a layer through which programming or erasing charge carriers can tunnel. Charge trapping layer 60 can be, for example, a layer of silicon nitride, silicon-rich silicon nitride, polycrystalline silicon, a combination of these, or any of the other well known charge trapping materials. Stoichiometric silicon nitride is $Si_xN_y$, for which x=3 and n=4; silicon-rich silicon nitride is a silicon/nitrogen material for which x/y is greater than ¾. Preferably, second insulating layer 62 comprises a silicon oxide. In an exemplary embodiment of the invention, multi-layer stack 58 has a total thickness that is no greater than about 25 nm. A control gate 66 overlies the upper oxide layer 62 of the charge trapping stack 58 of each gate stack 52, 54. The control gate may be formed of polycrystalline silicon and may be doped with an N-type impurity.

As illustrated in FIG. 2, the first and second gate stacks 52, 54 are separated by a trench 68 that has been formed in substrate 56 using gate stacks 52, 54 as etch masks. The trench 68 has a depth, indicated by double-headed arrow 72, in the range of about 100 to about 800 angstroms as measured from a surface 70 of substrate 56. An impurity doped region 74, otherwise known as a bit line region, is disposed underlying trench 68. In this regard, during programming of cell 52, secondary electrons resulting from secondary impact ionization are blocked by trench 68 and impurity doped region 74 and are not able to diffuse to cell 54. Similarly, during programming of cell 54, secondary electrons resulting from secondary impact ionization are blocked by trench 68 and impurity doped region 74 and are not able to diffuse to cell 52.

A conductor 76 is disposed within trench 68 and at least partially fills trench 68. Conductor 76 comprises any suitable conductive material such as, for example, tungsten (W), a metal silicide, polycrystalline silicon, and the like. In a preferred embodiment, conductor 76 has a thickness of at least 10 nm but does not have a thickness such that the conductor 76 and charge trapping layer 60 of multi-stack 58 are in electrical and/or physical contact.

Figure 3:
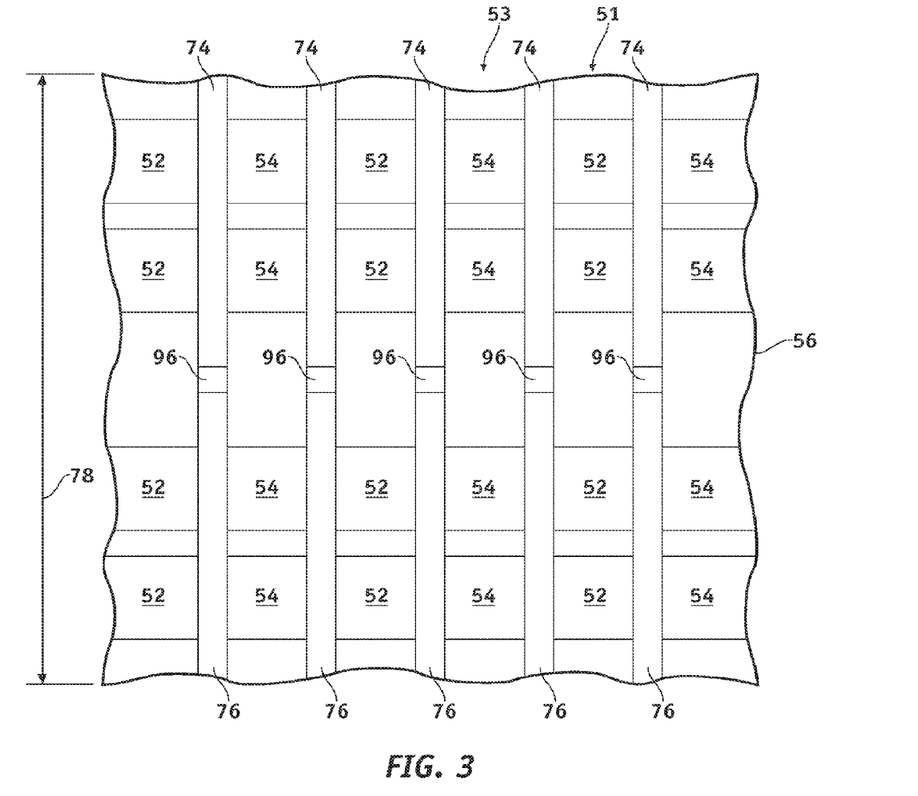
FIG. 3 is a top view of a portion of the dual bit memory device of FIG. 2.

FIG. 3 is a top view of a portion of memory device 50. As illustrated, a plurality 51 of first gate stacks 52 is formed in a linear manner along a length, designated by double arrow 78, of substrate 56. A plurality 53 of second gate stacks 54 also are formed in a linear manner parallel to the plurality of first gate stacks 52. Bit line 74 is disposed between the plurality 51 of first gate stacks 52 and the plurality 53 of second gate stacks 54 and extends along length 78 of substrate 56. Conductor 76 is disposed within trench 68 and extends along length 78. Because of its conductive nature, conductor 76 within trench 68 reduces the resistance of the bit lines 74, thus increasing the speed of memory device 50.

Conductive contact 96 may be formed to conductor 76 for electrical communication with bit line 74. Typically, to form a contact to bit line 74, an insulating material, such as a silicon oxide, may be deposited between gate stacks 52 and 54 and within trench 68 and a via or contact window is etched therethrough to the bitline. To decrease the width of the contact window, a second insulating material, such as a silicon nitride, then is conformally deposited over the first insulting material. However, with the presence of trench 68, the second insulating material may "pinch off" the contact window, thus preventing a subsequently deposited conductive material from contacting the bitline. Because conductor 76 provides a planar surface between first gate stack 52 and second gate stack 54, a conductive contact 96 can be made to conductor 76 and, hence, bit line 74 without "pinching off" challenges due to trench 68. Accordingly, the dimensions of memory device 50 can be reduced without adversely affecting subsequent fabrication steps or operation of device 50.

In accordance with an exemplary embodiment of the present invention, FIGS. 4-7 illustrate a method for fabricating a memory device, such as the flash memory device 50 of FIG. 2, that can be scaled with decreased device dimensions while overcoming challenges of transient program disturb. FIGS. 4-7 illustrate various cross-sectional views of flash memory device 50. Various steps in the manufacture of flash memory device 50 are well known and so, in the interest of brevity, many conventional steps will only be mentioned briefly herein or will be omitted entirely without providing well known process details.

Figure 4:
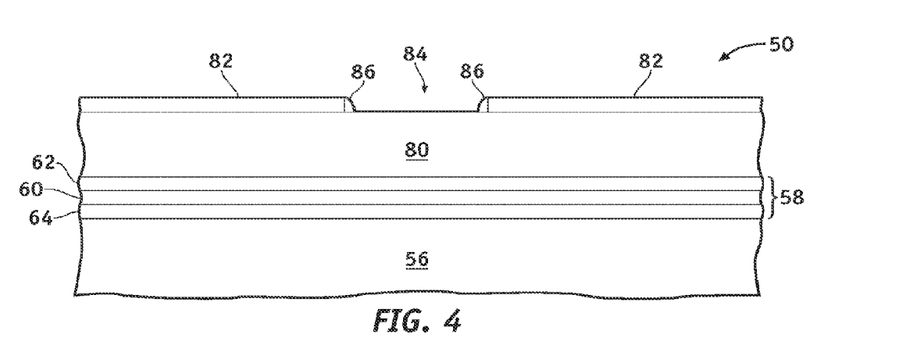
FIG. 4. 4-7 illustrate, in accordance with an exemplary embodiment of the present invention, a method for fabricating a portion of the dual bit memory device of FIG. 2.

As illustrated in FIG. 4, the manufacture of flash memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first insulating layer 64 and a charge trapping layer 60 of a multi-layer dielectric-charge trapping-dielectric stack 58 are formed overlying substrate 56. Preferably insulating layer 64 is a layer of silicon dioxide having a thickness of about 2-10 nanometers (nm), more preferably about 5 nm. Layer 64 can be a thermally grown layer of silicon dioxide or can be deposited, for example, by low pressure chemical vapor deposition (LPCVD). Charge trapping layer 60 can be deposited, for example, to a thickness of about 3 to 20 nm by chemical vapor deposition (CVD), plasma enhanced chemical vapor deposition (PECVD), LPCVD, or by atomic layer deposition (ALD). The silicon oxide layers can be deposited, for example, from either a tetraethylorthosilicate (TEOS) or $SiH_4$ (silane) source or can be grown thermally from silicon, silicon nitride, or silicon-rich silicon nitride. The silicon nitride or silicon-rich silicon nitride can be deposited, for example, from the reaction of dichlorosilane and ammonia.

A control gate material layer 80, preferably of polycrystalline silicon or, in the alternative, metal or other conductive material, is deposited overlying the multi-layer stack 58. The layer of polycrystalline silicon can be deposited as an impurity doped layer, but is preferably deposited as undoped polycrystalline silicon and is subsequently impurity doped by ion implantation. A layer 82 of antireflective coating material (ARC) such as silicon oxide, silicon nitride, or silicon oxynitride can be deposited onto the surface of the polycrystalline silicon layer 80 to aid in subsequently patterning the polycrystalline silicon. The polycrystalline material can be deposited to a thickness of about 300 angstroms to about 1200 angstroms by LPCVD by the hydrogen reduction of silane ($SiH_4$). ARC layer 82 can be deposited to a thickness of about 50 nm, also by LPCVD.

In one embodiment of the invention, the ARC layer 82 can be patterned using conventional photolithography techniques to form an opening 84. An insulating layer of silicon oxide or silicon nitride (not shown) can be deposited within opening 84 and overlying ARC layer 82 and then anisotropically etched, such as by reactive ion etching (RIE) using $CHF_3$, $CF_4$, or $SF_6$ chemistry or any other suitable method, to form spacers 86 about the sidewalls of ARC layer 82.

Figure 5:
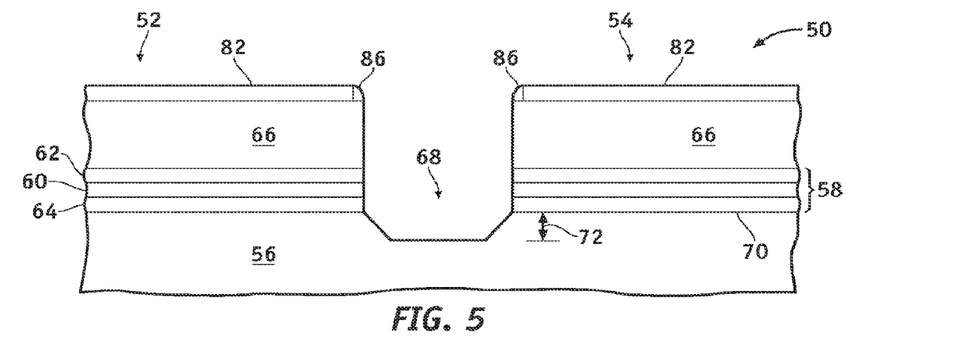

Referring to FIG. 5, the polycrystalline silicon layer 80 and the multi-layer stack 58 are etched by, for example, plasma etching in a Cl or $HBr/O_2$ chemistry, to form control gates 66 of a first gate stack 52 and a second gate stack 54. Silicon substrate 56 is etched by, for example, the same chemistry, to form a trench 68 within silicon substrate 56. As described above, trench 68 has a depth, illustrated by double-headed arrow 72, in the range of about 100 to about 800 angstroms as measured from a surface 70 of substrate 56.

Figure 6:
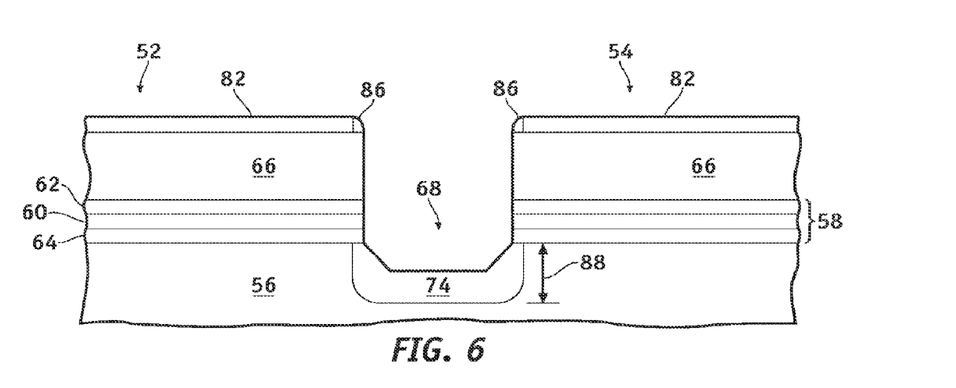

Referring to FIG. 6, after formation of trench 68, gate stacks 52 and 54 are used as an ion implantation mask to form an impurity doped region or bit line region 74 in silicon substrate 56 below trench 68. The bit line region 74 preferably is formed by implanting an N-type impurity dopant, preferably arsenic ions or phosphorous ions, using an ion implant energy in the range of about 2 keV to about 30 keV. Preferably, the ion implant energy is in the range of about 3 keV to about 20 keV. The bit line region 74 and the trench 68 have a combined depth, illustrated by double-headed arrow 88, of about 400 to about 1200 angstroms. Following the formation of bit line region 74, the ARC layer 82 and spacers 86 can be removed using conventional methods.

Figure 7:
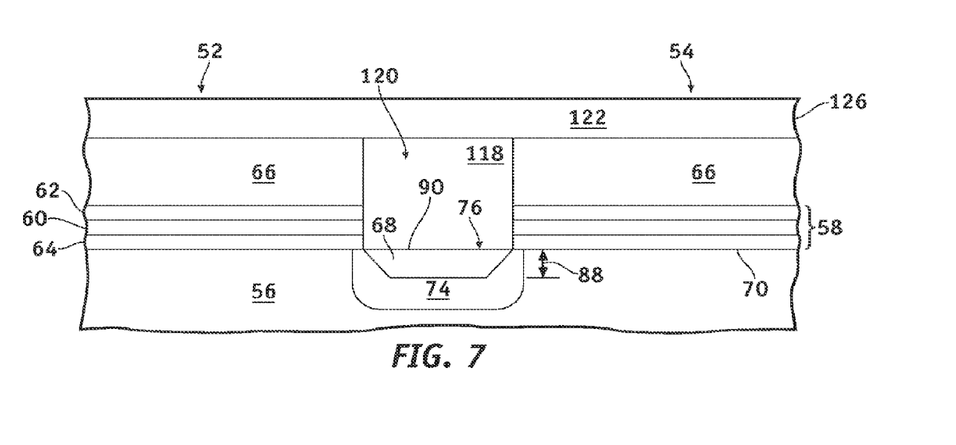

The method in accordance with an embodiment of the invention continues with the partial filling of trench 68 with a conductive material to form a conductor 76 within trench 68 and in electrical contact with bit line 74, as illustrated in FIG. 7. As described above, the conductive material may be any suitable conductive material such as, for example, W, metal silicide, polycrystalline silicon, and the like. In one exemplary embodiment of the invention, the conductive material may be deposited by CVD, PECVD, LPCVD, ALD, and the like and then etched to a desired thickness. In another exemplary embodiment of the invention, such as when forming conductor 76 from a metal silicide, the metal silicide layer is formed by depositing a silicide-forming metal in the trench and heating, such as by rapid thermal annealing (RTA), to cause the silicide-forming metal to react with silicon substrate 56. The silicide-forming metal can be, for example, cobalt, nickel, rhenium, ruthenium, or palladium. The silicide-forming metal can be deposited, for example, by sputtering. The RTA causes the formation of metal silicide anywhere the silicide-forming metal is in contact with exposed silicon. Any silicide-forming metal that is not in contact with exposed silicon does not react during the RTA to form a silicide and may subsequently be removed by wet etching in an $H_2O_2/H_2SO_4$ or $HNO_3/HCl$ solution. In an exemplary embodiment of the invention, the conductor 76 has a thickness, indicated by double-headed arrow 88, that is no less than 10 nm. In another exemplary embodiment of the invention, the conductor 76 is not so thick that it comes in electrical contact with charge trapping layer 60 causing an electrical short therebetween. In addition, the conductor 76 is not so thick that it causes a breakdown between a subsequently-formed word line 126, discussed in more detail below, and the bit line 74. In a preferred embodiment of the invention, the conductor 76 has a thickness such that a surface 90 of the conductor is approximately planar with surface 70 of substrate 56.

In accordance with another exemplary embodiment of the invention, any remaining portion of trench 68 and/or a space 120 between first gate stack 52 and second gate stack 54 that is not filled by conductor 76 may be filled by an insulating material 118. Insulating material 118 may be any suitable insulating material such as, for example, silicon oxide, silicon nitride, or, preferably, high density plasma silicon oxide (HDP) and may be deposited as a blanket layer by CVD, LPCVD, or the like. In one embodiment of the present invention, after deposition the insulating material 118 may be planarized to expose ARC layer 82 and spacers 86, which then may be removed by conventional methods. In another embodiment of the present invention, the insulating material 118, the ARC layer 82, and spacers 86 may be planarized to expose a surface of control gates 66.

The method in accordance with one embodiment of the invention is continued by depositing a blanket layer 122 of polycrystalline silicon or other conductive material in electrical contact with control gates 66. The blanket layer is preferably deposited as an impurity doped layer of polycrystalline silicon or can be deposited as a polycrystalline silicon that is subsequently doped by ion implantation. Although not seen in this cross sectional view, blanket layer 122 is photolithographically patterned and etched to form a word line 126 that is electrically coupled to control gates 66 and that is disposed perpendicular to bit line 74. As described above, conductor 76, which extends the length of bit line 74, reduces the resistance of bit line 74 and, hence, increases the speed of memory device 50. In addition, because conductor 76 provides a planar surface between first gate stack 52 and second gate stack 54, a conductive contact (not shown) can be made through insulating layer 118 to conductor 76 and, hence, bit line 74 without "pinching off" challenges due to trench 68. Accordingly, the dimensions of memory device 50 can be reduced without adversely affecting subsequent fabrication steps or operation of device 50.

Figure 8:
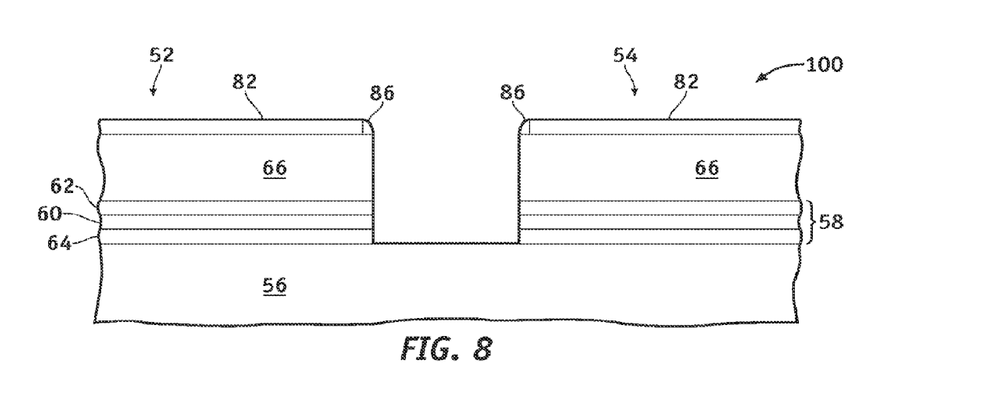
FIGS. 8-12 illustrate a method for fabricating a portion of a dual bit memory device in accordance with another exemplary embodiment of the present invention.

FIGS. 8-12 illustrate a method for fabricating a memory device 100 in accordance with another exemplary embodiment of the present invention. Flash memory device 100 is similar to flash memory device 50 of FIGS. 4-7 and, accordingly, elements of FIGS. 8-12 that have the same reference numbers as elements of FIGS. 4-7 are the same elements of FIGS. 4-7 and may be formed of any of the same materials and by any of the same methods as described above with reference to FIGS. 4-7. The method described with reference to FIGS. 8-12 begins by utilizing the steps described above with reference to FIG. 4, which, for brevity, will not be described again. Accordingly, after performing the steps illustrated in FIG. 4, the polycrystalline silicon layer 80 and the multi-layer stack 58 are etched to form control gates 66 of first gate stack 52 and second gate stack 54 and to expose silicon substrate 56, as illustrated in FIG. 8.

Figure 9:
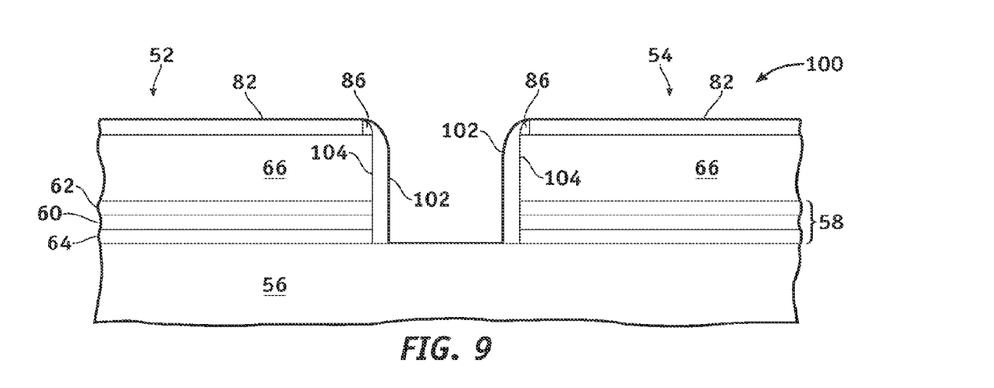

After formation of gate stacks 52 and 54, a gate spacer material layer (not shown) is deposited conformally overlying gate stacks 52 and 54 and substrate 56. The gate spacer material layer may be formed of any suitable insulating material, such as silicon oxide, silicon nitride, or a suitable polymer. The gate spacer material then is anisotropically etched by, for example, RIE using a $CHF_3$, $CF_4$, or $SF_6$ chemistry, to form gate spacers 102 about sidewalls 104 of gate stacks 52 and 54, as illustrated in FIG. 9.

Figure 10:
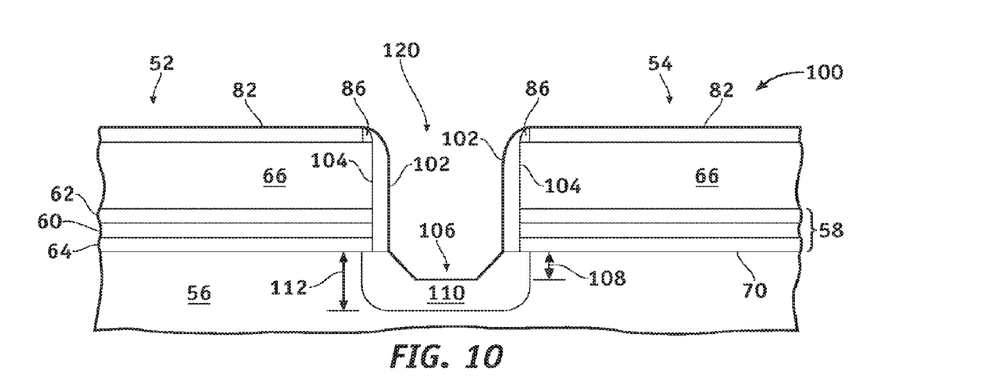

Referring to FIG. 10, using the gate spacers 102 and gate stacks 52 and 54 as an etch mask, the silicon substrate 56 is etched to form a trench 106 in the silicon substrate. Silicon substrate 56 may be etched by, for example, plasma etching in a $C_4H_8$ and $O_2$ chemistry and/or an HBr chemistry. In an exemplary embodiment of the invention, the trench 106 has a depth, illustrated by a double-headed arrow 108, in the range of about 100 to about 800 angstroms as measured from surface 70 of substrate 56. After formation of trench 106, gate stacks 52 and 54 and gate spacers 102 are used as an ion implantation mask to form an impurity doped region or bit line region 110 in silicon substrate 56 below trench 106. The bit line region 110 preferably is formed by implanting an N-type impurity dopant, preferably arsenic ions or phosphorous ions, using an ion plasma energy in the range of about 2 keV to about 30 keV. Preferably, the ion implant energy is in the range of about 3 keV to about 20 keV. In an exemplary embodiment of the invention, the bit line region 110 and the trench 106 have a combined depth, illustrated by double-headed arrow 112, of about 400 to 1200 angstroms. By using gate spacers 102, the width of space 120 between memory cells 52 and 54 can be made smaller. Accordingly, the depth 112 of trench 106 and bit line region 110 can be larger than the combined depth of trench 68 and bit line region 74 of FIG. 7 while being fabricated using the same ion implant energy.

Figure 11:
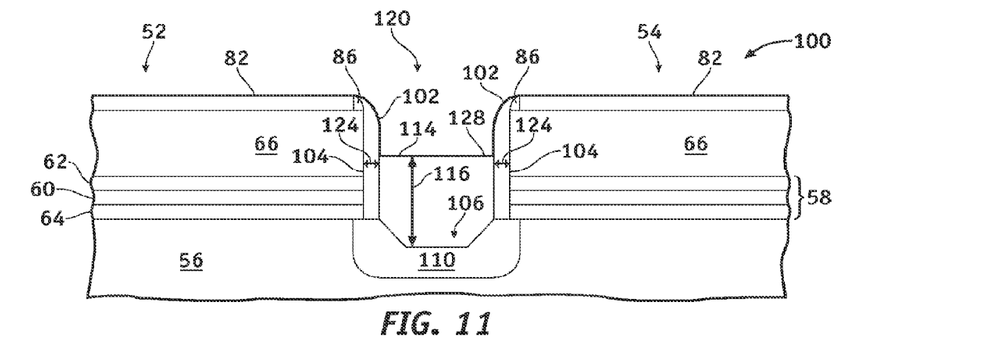

The method in accordance with an embodiment of the invention continues with the at least a partial filling of trench 106 with a conductive material to form a conductor 114, as illustrated in FIG. 11. Conductor 114 can be formed using the same materials and the same methods as described above for conductor 76 of FIG. 7. In one embodiment of the present invention, trench 106 is partially filled by the conductor 114. In another embodiment of the present invention, trench 106 is approximately fully filled by the conductor 114. In yet another embodiment of the present invention, depending on a thickness, indicated by double-headed arrow 124, of gate spacers 102, conductor 114 may completely fill trench 106 and have a thickness, indicated by double-headed arrow 116, as measured from the bottom of trench 106, such that the conductor 114 partially fills space 120 between sidewall spacers 102. If conductor 114 has a thickness 116 such that a surface 128 of conductor 114 extends to or past charge trapping layer 60, gate spacers 102 have a thickness 124 such that conductor 114 is electrically isolated from charge trapping layer 60. The presence of gate spacers 102 permits conductor 114 to have a greater thickness than that of conductor 76 of FIG. 7, which thus decreases the resistance of bit line 110 and increases the speed of memory device 100.

Figure 12:
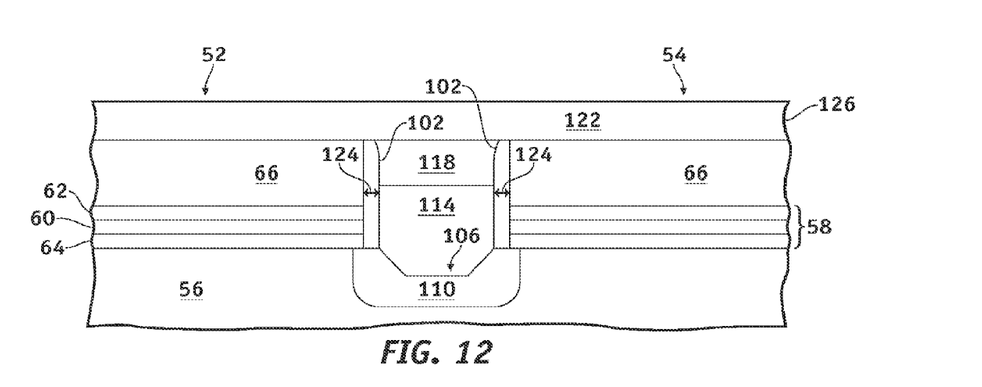
Figure 13:
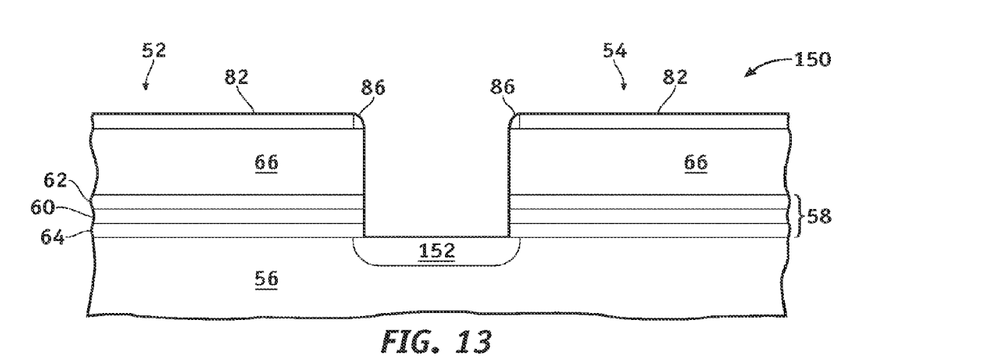
FIGS. 13-17 illustrate a method for fabricating a portion of a dual bit memory device in accordance with a further exemplary embodiment of the present invention.

Referring to FIG. 12, in accordance with another exemplary embodiment of the invention, any remaining portion of trench 106 and/or space 120 that is not filled by conductor 114 may be filled by an insulating material 118. Insulating material 118 may be any suitable insulating material such as, for example, silicon oxide, silicon nitride, or, preferably, high density plasma silicon oxide (HDP) and may be deposited as a blanket layer by CVD, LPCVD, or the like. In one embodiment of the present invention, after deposition the insulating material 118 may be planarized to expose ARC layer 82 and spacers 86, which then may be removed by conventional methods. In another embodiment of the present invention, the insulating material 118, the ARC layer 82, and spacers 86 may be planarized to expose a surface of control gates 66.

The method in accordance with one embodiment of the invention is continued by depositing a blanket layer 122 of polycrystalline silicon or other conductive material in electrical contact with control gates 66. The blanket layer is preferably deposited as an impurity doped layer of polycrystalline silicon or can be deposited as a polycrystalline silicon that is subsequently doped by ion implantation. Although not seen in this cross sectional view, blanket layer 122 is photolithographically patterned and etched to form a word line 126 electrically coupled to control gates 66. As described above, gate spacers 102 electrically isolate charge trapping layer 60 of charge trapping stack 58 from conductor 114. In addition, it will be appreciated that gate spacers 102 have a thickness 124 sufficient to prevent breakdown between the word line 126 and the control gates 66.

FIGS. 13-17 illustrate a method for fabricating a memory device 150 in accordance with another exemplary embodiment of the present invention. Flash memory device 150 is similar to flash memory device 50 of FIGS. 4-7 and, accordingly, elements of FIGS. 13-17 that have the same reference numbers as elements of FIGS. 4-7 are the same elements of FIGS. 4-7 and may be formed of any of the same materials and by any of the same methods as described above with reference to FIGS. 4-7. The method described with reference to FIGS. 13-17 begins by utilizing the steps described above with reference to FIG. 4, which, for brevity, will not be described again. Accordingly, after performing the steps illustrated in FIG. 4, the polycrystalline silicon layer 80 and the multi-layer stack 58 are etched to form control gates 66 of first gate stack 52 and second gate stack 54 and to expose silicon substrate 56. Gate stacks 52 and 54 are used as an ion implantation mask to form a first, shallow impurity doped region or bit line region 152 in silicon substrate 56. First bit line region 152 preferably is formed by implanting an N-type impurity dopant, preferably arsenic ions or phosphorous ions, using an ion implant energy in the range of about 2 keV to about 30 keV. Preferably, the ion implant energy is in the range of about 3 keV to about 15 keV.

Figure 14:
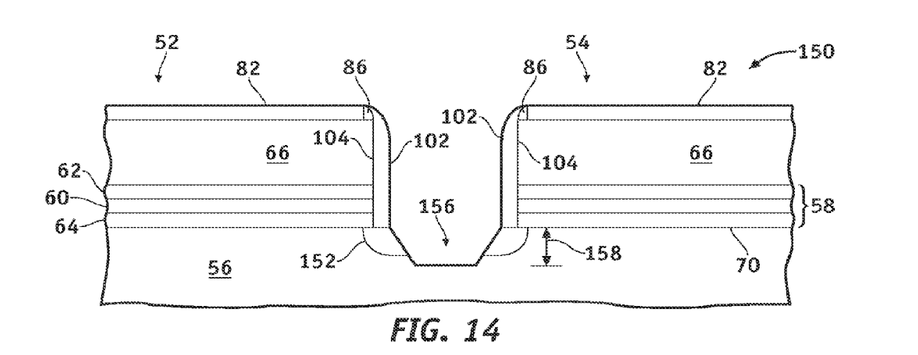

The method in accordance with one embodiment of the invention is continued by depositing a gate spacer material layer (not shown) conformally overlying gate stacks 52 and 54 and substrate 56, as illustrated in FIG. 14. The gate spacer material then is anisotropically etched by, for example, RIE using a $CHF_3$, $CF_4$, or $SF_6$ chemistry, to form gate spacers 102 about the sidewalls 104 of gate stacks 52 and 54. Using the gate spacers 102 and gate stacks 52 and 54 as an etch mask, the silicon substrate 56 is etched by, for example, plasma etching in a $C_4F_8$ and $O_2$ chemistry, to form a trench 156 in the silicon substrate. Trench 156 has a depth, illustrated by double-headed arrow 158, in the range of about 100 to about 800 angstroms as measured from surface 70 of substrate 56. Trench 156 can be shallower or deeper than bit line region 152.

Figure 15:
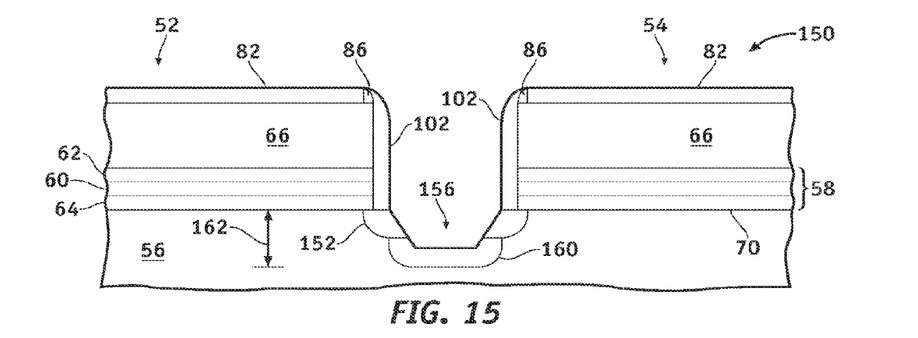

Referring to FIG. 15, after formation of trench 156, gate stacks 52 and 54 and gate spacers 102 are used as an ion implantation mask to form a second, deeper impurity doped region or bit line region 160 in silicon substrate 56 below trench 106. The second bit line region 160 preferably is formed by implanting an N-type impurity dopant, preferably arsenic ions or phosphorous ions, using an ion implant energy in the range of about 5 keV to about 40 keV. The trench 156 and second bit line region 160 preferably have a combined depth, illustrated by double-headed arrow 162, of about 400 to 1200 angstroms. Because of the presence of trench 156, second bit line region 160 does not have to be formed at as high an implant energy to block the diffusion of secondary electrons generated during programming as would be required without the presence of trench 156.

Figure 16:
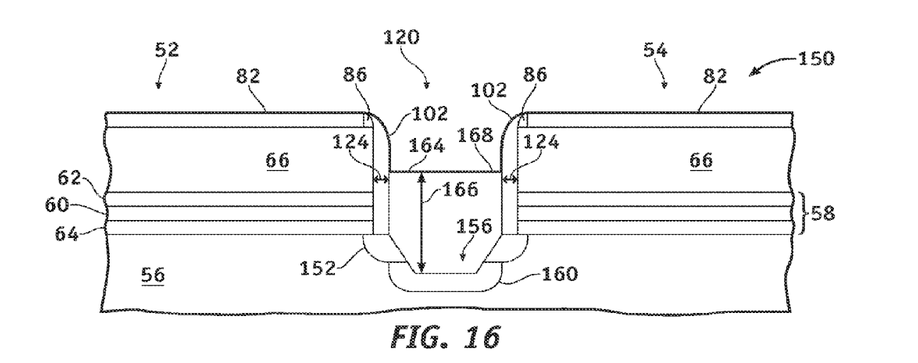

The method in accordance with an embodiment of the invention continues with the at least a partial filling of trench 156 with a conductive material to form a conductor 164, as illustrated in FIG. 16. Conductor 164 can be formed using the same materials and the same methods as described above for conductor 76 of FIG. 7. Similar to conductor 114 of FIGS. 11 and 12, in one embodiment of the present invention, trench 156 is partially filled by the conductor 164. In another embodiment of the present invention, trench 156 is approximately fully filled by the conductor 164. In yet another embodiment of the present invention, depending on a thickness 124 of gate spacers 102, conductor 164 may completely fill trench 156 and have a thickness, indicated by double-headed arrow 166, as measured from the bottom of trench 156, such that the conductor 164 partially fills space 120 between sidewall spacers 102, as illustrated in FIG. 16. If conductor 164 has a thickness 166 such that a surface 168 of conductor 164 extends to or past charge trapping layer 60, gate spacers 102 have a thickness 124 such that conductor 164 is electrically isolated from charge trapping layer 60. As described above, the presence of gate spacers 102 permits conductor 164 to have a greater thickness than that of conductor 76 of FIG. 7, which thus decreases the resistance of bit lines 152 and 160 and increases the speed of memory device 150.

Figure 17:
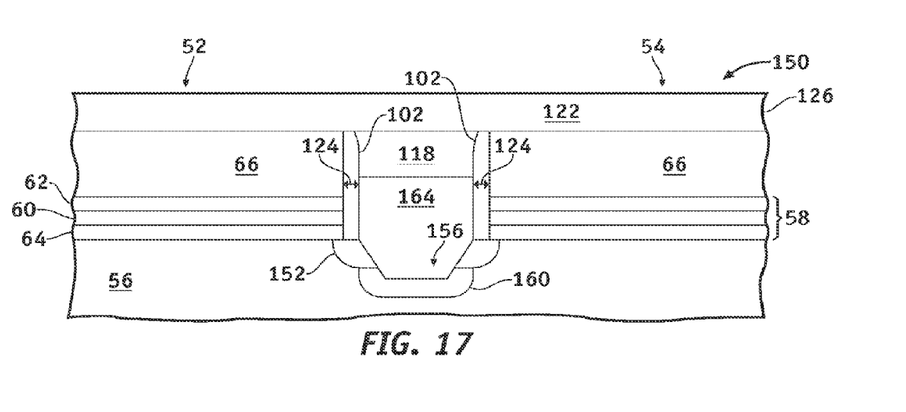
Figure 18:
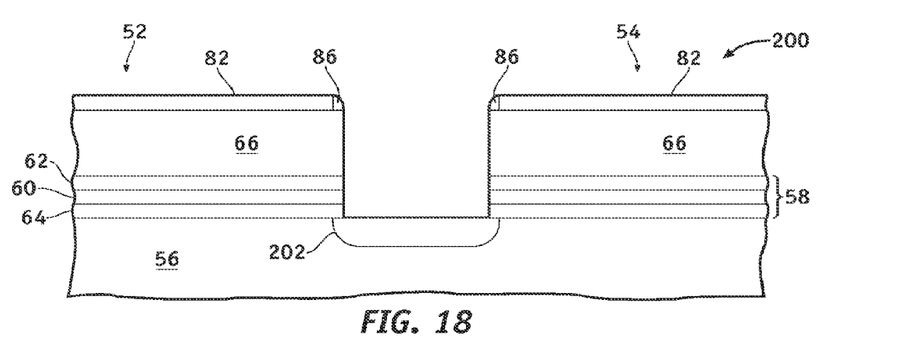
FIGS. 18-21 illustrate a method for fabricating a portion of a dual bit memory device in accordance with another exemplary embodiment of the present invention.

Referring to FIG. 17, in accordance with an exemplary embodiment of the invention, any remaining portion of trench 156 and/or space 120 that is not filled by conductor 164 may be filled by insulating material 118. In one embodiment of the present invention, after deposition the insulating material 118 may be planarized to expose ARC layer 82 and spacers 86, which then may be removed by conventional methods. In another embodiment of the present invention, the insulating material 118, the ARC layer 82, and spacers 86 may be planarized to expose a surface of control gates 66.

The method in accordance with one embodiment of the invention is continued by depositing blanket layer 122 of polycrystalline silicon or other conductive material in electrical contact with control gates 66. Although not seen in this cross sectional view, blanket layer 122 is photolithographically patterned and etched to form word line 126 electrically coupled to control gates 66. As described above, gate spacers 102 electrically isolate charge trapping layer 60 of charge trapping stack 58 from conductor 164. In addition, it will be appreciated that gate spacers 102 have a thickness 124 sufficient to prevent breakdown between the word line 126 and the control gates 66.

FIGS. 18-21 illustrate a method for fabricating a memory device 200 in accordance with another exemplary embodiment of the present invention. Flash memory device 200 is similar to flash memory device 50 of FIGS. 4-7 and, accordingly, elements of FIGS. 18-21 that have the same reference numbers as elements of FIGS. 4-7 are the same elements of FIGS. 4-7 and may be formed of any of the same materials and by any of the same methods as described above with reference to FIGS. 4-7. The method described with reference to FIGS. 18-21 begins by utilizing the steps described above with reference to FIG. 4, which, for brevity, will not be described again. Accordingly, after performing the steps illustrated in FIG. 4, the polycrystalline silicon layer 80 and the multi-layer stack 58 are etched to form control gates 66 of first gate stack 52 and second gate stack 54 and to expose silicon substrate 56. Gate stacks 52 and 54 are used as an ion implantation mask to form a first, shallow impurity doped region or bit line region 202 in silicon substrate 56. First bit line region 202 preferably is formed by implanting an N-type impurity dopant, preferably arsenic ions or phosphorous ions, using an ion plasma energy in the range of about 2 keV to about 30 keV. Preferably, the ion implant energy is in the range of about 3 keV to about 20 keV.

Figure 19:
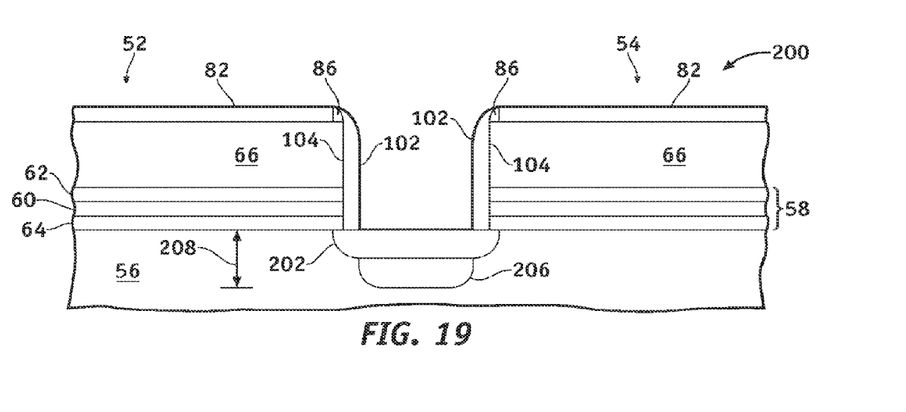

Referring to FIG. 19, after formation of first bit line region 202, a gate spacer material layer (not shown) is deposited conformally overlying gate stacks 52 and 54 and substrate 56. The gate spacer material then is anisotropically etched by, for example, RIE using a $CHF_3$, $CF_4$, or $SF_6$ chemistry, to form gate spacers 102 about the sidewalls 104 of gate stacks 52 and 54. Gate stacks 52 and 54 and gate spacers 102 are used as an ion implantation mask to form a second, deeper impurity doped region or bit line region 206 in silicon substrate 56. The second bit line region 206 preferably is formed by implanting an N-type impurity dopant, preferably arsenic ions or phosphorous ions, using an ion plasma energy in the range of about 10 keV to about 50 keV. The first bit line region 202 and the second bit line region 206 preferably have a combined depth, illustrated by double-headed arrow 208, as measured from surface 70 of substrate 56 of about 400 to 1200 angstroms.

Figure 20:
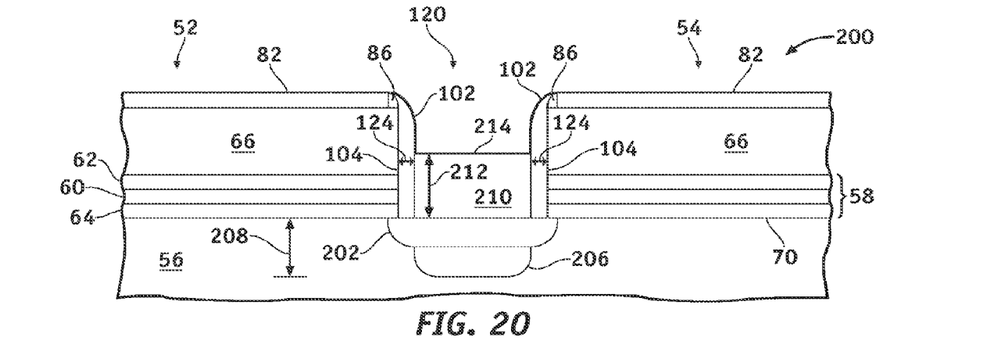

The method in accordance with an embodiment of the invention continues with the at least a partial filling of space 120 with a conductive material to form a conductor 210, as illustrated in FIG. 20. Conductor 210 can be formed using the same materials and the same methods as described above for conductor 76 of FIG. 7. Conductor 210 may have a thickness, indicated by double-headed arrow 212, as measured from substrate 56, such that the conductor 210 partially fills space 120 between sidewall spacers 102. If conductor 164 has a thickness 212 such that a surface 214 of conductor 164 extends to or past charge trapping layer 60, gate spacers 102 have a thickness 124 such that conductor 210 is electrically isolated from charge trapping layer 60. As described above, the presence of gate spacers 102 permits conductor 210 to have a greater thickness than that of conductor 76 of FIG. 7, which thus decreases the resistance of bit lines 202 and 206 and increases the speed of memory device 200.

Figure 21:
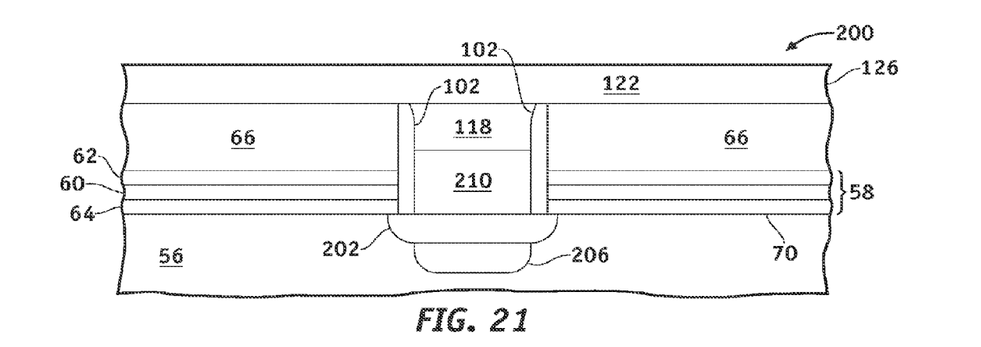

Referring to FIG. 21, in accordance with an exemplary embodiment of the invention, any remaining portion of space 120 that is not filled by conductor 210 may be filled by insulating material 118. In one embodiment of the present invention, after deposition the insulating material 118 may be planarized to expose ARC layer 82 and spacers 86, which then may be removed by conventional methods. In another embodiment of the present invention, the insulating material 118, the ARC layer 82, and spacers 86 may be planarized to expose a surface of control gates 66.

The method in accordance with one embodiment of the invention is continued by depositing blanket layer 122 of polycrystalline silicon or other conductive material in electrical contact with control gates 66. Although not seen in this cross sectional view, blanket layer 122 is photolithographically patterned and etched to form word line 126 electrically coupled to control gates 66. As described above, gate spacers 102 electrically isolate charge trapping layer 60 of charge trapping stack 58 from conductor 210. In addition, it will be appreciated that gate spacers 102 have a thickness 124 sufficient to prevent breakdown between the word line 126 and the control gates 66.

Accordingly, flash memory devices and methods for fabricating flash memory devices have been provided. The devices and methods provide for the scaling of the memory devices while overcoming transient program disturb challenges. In addition, the methods provide for the reduction in bit line resistance and, hence, a corresponding increase in speed of the memory device. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A memory device comprising:
 a plurality of first gate stacks and a plurality of second gate stacks overlying a substrate, wherein the plurality of first gate stacks are disposed in a linear manner along a length of the substrate and the plurality of second gate stacks are disposed in a linear manner along the length of the substrate parallel to the plurality of first gate stacks;
 a conductor disposed within a trench in the substrate between the plurality of first gate stacks and the plurality of second gate stacks, wherein the conductor and the trench extend along the length of the substrate; and
 a first impurity doped region disposed comprising first and second parts wherein the first part is formed adjacent the sides of the trench and the second part is formed within the substrate underlying the trench and the conductor, wherein the first impurity doped region extends along the length of substrate.

2. The memory device of claim 1, wherein the conductor comprises tungsten, a metal silicide or a polycrystalline silicon.

3. The memory device of claim 1, further comprising gate spacers disposed along sidewalls of each of the plurality of first gate stacks and each of the plurality of second gate stacks.

4. The memory device of claim 3, wherein each of the plurality of first gate stacks and the plurality of second gate stacks comprises a charge trapping layer overlying the substrate and a control gate overlying the charge trapping layer.

5. The memory device of claim 4, wherein the gate spacers have a thickness sufficient to electrically isolate the conductor from the charge trapping layers of each of the plurality of first gate stacks and a plurality of second gate stacks.

6. The memory device of claim 4, further comprising an insulating material overlying the conductor and between the plurality of first gate stacks and the plurality of second gate stacks and a word line disposed overlying the insulating material and perpendicular to the first impurity doped region.

7. The memory device of claim 6, wherein the gate spacers have a thickness sufficient to prevent breakdown between the word line and the control gate of each of the plurality of first gate stacks and the plurality of second gate stacks.

8. The memory device of claim 1, further comprising a second impurity doped region disposed within the substrate, wherein the second impurity doped region extends along the length of substrate and is shallower than the first impurity doped region.

9. A memory device comprising:
 a plurality of first gate stacks and a plurality of second gate stacks overlying a substrate, wherein the plurality of first gate stacks are disposed in a linear manner along a length of the substrate and the plurality of second gate stacks are disposed in a linear manner along the length of the substrate parallel to the plurality of first gate stacks;
 a first impurity doped region disposed within the substrate between the plurality of first gate stacks and the plurality of second gate stacks along the length of substrate comprising first and second parts wherein the first part is formed adjacent the sides of a trench and the second part is formed within the substrate underlying the trench;

a second impurity doped region disposed within the substrate between the plurality of first gate stacks and the plurality of second gate stacks along the length of substrate, wherein the second impurity doped region is disposed deeper within the substrate than the first impurity doped region; and a conductor disposed overlying the substrate between the plurality of first gate stacks and a plurality of second gate stacks, wherein the conductor extends along the length of the substrate and is in electrical contact with the first and second impurity doped regions.

10. The memory device of claim 9, wherein the conductor is formed of tungsten, metal silicide, or polycrystalline silicon.

* * * * *